(12) United States Patent
Kwak et al.

(10) Patent No.: US 7,544,565 B2
(45) Date of Patent: Jun. 9, 2009

(54) SEMICONDUCTOR DEVICES HAVING A CONVEX ACTIVE REGION AND METHODS OF FORMING THE SAME

(75) Inventors: Dong-Hwa Kwak, Gyeonggi-do (KR); Jae-Kwan Park, Gyeonggi-do (KR); Yong-Sik Yim, Gyeonggi-do (KR); Won-Cheol Jeong, Seoul (KR); Jae-Hwang Sim, Seoul-do (KR)

(73) Assignee: Samsung Electronics Co., Ltd. (KR)

( * ) Notice: Subject to any disclaimer, the term of this patent is extended or adjusted under 35 U.S.C. 154(b) by 351 days.

(21) Appl. No.: 11/642,198

(22) Filed: Dec. 20, 2006

(65) Prior Publication Data

US 2008/0057644 A1 Mar. 6, 2008

(30) Foreign Application Priority Data

Aug. 31, 2006 (KR) ...................... 10-2006-0083652

(51) Int. Cl.
*H01L 21/8247* (2006.01)

(52) U.S. Cl. ...................................... 438/257

(58) Field of Classification Search ....................... None
See application file for complete search history.

(56) References Cited

U.S. PATENT DOCUMENTS 6,777,741 B2   8/2004   Rabkin et al. ............... 257/315

6,989,303 B2 * 1/2006 Mori ......................... 438/201

FOREIGN PATENT DOCUMENTS

| JP | 05-299497 A | 11/1993 |
|----|-------------|---------|
| JP | 10-022403 A | 1/1998 |
| JP | 2002-033476 A | 1/2002 |
| KR | 1020000001034 | 1/2000 |
| KR | 1020000048421 A | 7/2000 |
| KR | 1020050039627 A | 4/2005 |
| KR | 1020050101668 | 10/2005 |
| KR | 1020060019470 | 3/2006 |

* cited by examiner

*Primary Examiner*—Tu T Nguyen
*Assistant Examiner*—Mohammad M Choudhry
(74) *Attorney, Agent, or Firm*—Myers Bigel Sibley & Sajovec

(57) ABSTRACT

Methods of forming a semiconductor device include forming a trench mask pattern on a semiconductor substrate having active regions and device isolation regions. A thermal oxidation process is performed using the trench mask pattern as a diffusion mask to form a thermal oxide layer defining a convex upper surface of the active regions. The thermal oxide layer and the semiconductor substrate are etched using the trench mask pattern as an etch mask to form trenches defining convex upper surfaces of the active regions. The trench mask pattern is removed to expose the convex upper surfaces of the active regions. Gate patterns are formed extending over the active regions.

17 Claims, 14 Drawing Sheets

[Cell Array Region]

[Cell Array Region]

[Peripheral Circuit Region]

[Cell Array Region]

[Peripheral Circuit Region]

[Cell Array Region]

[Peripheral Circuit Region]

[Cell Array Region]

[Peripheral Circuit Region]

[Peripheral Circuit Region]

[Cell Array Region]

[Peripheral Circuit Region]

[Cell Array Region]

[Peripheral Circuit Region]

[Cell Array Region]

[Peripheral Circuit Region]

[Cell Array Region]

[Peripheral Circuit Region]

[Cell Array Region]

[Peripheral Circuit Region]

[Cell Array Region]

[Peripheral Circuit Region]

[Cell Array Region]

SEMICONDUCTOR DEVICES HAVING A CONVEX ACTIVE REGION AND METHODS OF FORMING THE SAME

CROSS-REFERENCE TO RELATED APPLICATIONS

This application is related to and claims priority under 35 USC § 119 from Korean Patent Application No. 2006-83652, filed on Aug. 31, 2006 in the Korean Intellectual Property Office, the disclosure of which is incorporated herein by reference in its entirety.

BACKGROUND OF THE INVENTION

The present invention disclosed herein relates to semiconductor devices and methods of forming the same, and more particularly, to semiconductor devices having a convex active region and methods of forming the same.

Generally, a field effect transistor (FET) includes an active region, a gate electrode crossing over the active region and source/drain electrodes formed adjacent to the gate electrode. The active region under the gate electrode is used as a channel region that provides a moving path for charges between source/drain regions formed in the active region on respective sides of the gate electrode. In other words, the channel region is the active region between the source and drain electrodes.

As the integration density of semiconductor devices increases, the widths of the gate electrodes and active regions have generally been reduced. However, as the width of the gate electrode is reduced, a length of the channel region (i.e., a space between the source region and the drain region) is also reduced. If the width of the active region is reduced, the width of the channel region may also be reduced, which may cause a narrow width effect that generally decreases a drain current.

In recent years, to address technical problems, including the short channel effect or the narrow channel effect, a fin-FET having a fin-shaped active region has been proposed. In the fin-FET, as a facing area between the gate electrode and the channel region is increased, the channel width can be increased, in comparison with a planar FET, and an electric potential of the channel region can be effectively controlled.

However, in a typical conventional fin-FET, a conductive residue may be formed between gate electrodes, which may result in a gate bridge phenomenon. More specifically, FIGS. 1A and 1B are perspective views illustrating the gate bridge occurring in a conventional method of fabricating a fin-FET.

Referring to FIGS. 1A and 1B, a device isolation pattern 20 is formed on a predetermined region of a semiconductor (integrated circuit) substrate 10 to define active regions 15. The device isolation pattern 20 is recessed to expose a top surface and upper portions of sidewalls (hereinafter, referred to as upper sidewalls) of the active regions 15. A gate insulating layer 25 is formed on the top surface and the upper sidewalls of the exposed active regions 15. A gate conductive layer 30 is formed on the semiconductor device in the region where the gate insulating layer 25 is formed.

As seen in FIG. 1B, the gate conductive layer 30 is patterned to form gate patterns 35 crossing over the active regions 15. The forming of the gate patterns 35 includes etching the gate conductive layer 30 until the top surfaces of the device isolation pattern 20 and the active regions 15 are exposed.

Due to a height difference between the active regions 15 and the device isolation pattern 20, a deposition thickness $h_1$ of the gate conductive layer 30 is smaller than a vertical thickness $h_2$ of the gate conductive layer 30 at the side of the active regions 15. Due to this thickness difference, a conductive residue 50 electrically connecting the gate patterns 35 to each other may be formed on the side surfaces of the active regions 15 as a result of the etching process used in patterning the gate conductive layer 30. The conductive residue 50 may cause defects, such as the gate bridge.

A conventional floating gate type flash memory device may have various technical problems caused by increasing an aspect ratio of a gate pattern in high-density devices. To address such problems, a charge trap (floating gate) type nonvolatile memory device has been proposed, which includes a tunneling insulating layer (interposed between the active region and the gate electrode), a charge storage layer, and a blocking dielectric layer. However, due to the increase of the aspect ratio of a gap region with the high integration devices, it is generally necessary to reduce the thickness of the blocking dielectric layer. If the thickness of the blocking dielectric layer is not reduced, the facing area between the gate pattern and the charge storage layer may be reduced by the blocking dielectric layer filling an upper portion of the gap region. However, reducing the thickness of the blocking dielectric layer may cause problems with an electrical property of the memory cell, which may be deteriorated due to leakage current.

SUMMARY OF THE INVENTION

Some embodiments of the present invention provide methods of forming a semiconductor device. A trench mask pattern is formed on a semiconductor substrate having active regions and device isolation regions. A thermal oxidation process is performed using the trench mask pattern as a diffusion mask to form a thermal oxide layer defining a convex upper surface of the active regions. The thermal oxide layer and the semiconductor substrate are etched using the trench mask pattern as an etch mask to form trenches defining convex upper surfaces of the active regions. The trench mask pattern is removed to expose the convex upper surfaces of the active regions. Gate patterns are formed extending over the active regions.

In further embodiments, etching the thermal oxide layer is followed by forming device isolation patterns filling the trenches. Forming the trench mask pattern includes forming an oxide pattern on the semiconductor substrate and forming a nitride pattern as the diffusion mask on the oxide pattern. Forming the trench mask pattern may include forming the oxide layer and the nitride layer on the semiconductor substrate and patterning the oxide layer and the nitride layer to form the trench mask pattern defining preliminary cell trenches. The preliminary cell trenches are formed on the device isolation regions and bottom surfaces of the preliminary cell trenches are lower than a top surface of the semiconductor substrate in the active regions. A radius of curvature of the convex upper surface of the active regions and a thickness of the thermal oxide layer at edges of the trench mask pattern may be controlled based on a height difference between the bottom surface of the preliminary cell trench and the top surface of the semiconductor substrate in the active regions.

In other embodiments, performing the thermal oxidation process includes performing the thermal oxidation process in a temperature range of about 600 to about 1,500 degrees Celsius for about 10 seconds to about 1 hour in a gas ambient including oxygen atoms. Performing the thermal oxidation process may include performing the thermal oxidation process to provide a thickness of the thermal oxide layer under edge portions of the trench mask pattern greater than a thickness of the thermal oxide layer under a central portion of the trench mask pattern. Forming the nitride pattern may include forming the nitride pattern to a thickness that limits oxygen diffusion while performing the thermal oxidation process to provide the thickness of the thermal oxide layer under the edge portions greater than the thickness of the thermal oxide layer under the central portion.

In further embodiments, forming the gate patterns includes recessing the device isolation regions to expose sidewalls of the active regions and forming a cell gate layer on the active regions and the recessed device isolation pattern. The cell gate layer includes a tunnel insulating layer, a charge storage layer, a blocking dielectric layer and a cell gate electrode layer. The cell gate layer is patterned to form the gate patterns extending over the active regions. The cell gate electrode layer may be a metal nitride and the charge storage layer may be an oxide and/or nitride of silicon, metal and/or metal silicide and the blocking insulating layer may be an insulating material having a higher dielectric constant than a dielectric constant of the charge storage layer. The charge storage layer may be a silicon nitride layer, the blocking dielectric layer may be an aluminum oxide layer and the cell gate electrode layer may be a tantalum nitride layer. Forming the cell gate layer may be preceded by forming hemispherical silicon grains on the convex upper surface of the active regions.

In other embodiments, the semiconductor substrate includes a cell array region and a peripheral circuit region. Etching the thermal oxide layer includes forming a photoresist layer covering the cell array region and exposing the peripheral circuit region, etching the semiconductor substrate using the photoresist pattern and the trench mask pattern as an etch mask to form preliminary peripheral trenches in the peripheral circuit region, removing the photoresist pattern and then etching the semiconductor substrate of the cell array region and the bottom surfaces of the preliminary peripheral trenches of the peripheral circuit region using the trench mask pattern as an etch mask to form cell trenches in the cell array region and peripheral trenches in the peripheral circuit region. A depth of the peripheral trench may be substantially equal to a sum of a depth of the preliminary peripheral trench and a depth of the cell trench.

In yet further embodiments, forming the gate patterns includes forming cell gate patterns in the cell array region and forming peripheral gate patterns in the peripheral circuit region. Forming the cell gate patterns includes forming a tunnel insulating pattern on the semiconductor substrate, forming a charge storage pattern on the tunnel insulating pattern, forming a blocking dielectric pattern on the charge storage pattern and forming a cell gate electrode on the blocking dielectric pattern. Forming the peripheral gate patterns includes forming a peripheral gate insulating pattern on the semiconductor substrate and forming a peripheral gate conductive pattern on the peripheral gate insulating pattern.

In other embodiments, forming the cell gate patterns includes recessing the device isolation regions in the cell array region to expose sidewalls of the active regions in the cell array region. A cell gate layer, including a tunnel insulating layer, a charge storage layer, a blocking dielectric layer and a cell gate electrode layer, is formed on the recessed device isolation regions and the active regions in the cell array region. The cell gate layer is patterned to form the cell gate patterns extending over the active regions.

In further embodiments, forming the gate patterns includes forming a peripheral gate layer on the semiconductor structure in a region where the trench mask patterns are removed. The peripheral gate layer is patterned to remove the peripheral gate layer from the cell array region. The device isolation regions are recessed in the cell array region to expose sidewalls of the active region in the cell array region. A cell gate layer is formed on the recessed device regions and active areas in the cell array region. The cell gate layer is patterned to form the gate patterns extending over the active regions.

In further embodiments, forming the cell gate layer includes forming a tunnel insulating layer on the semiconductor substrate, forming a charge storage layer on the tunnel insulating layer, forming a blocking dielectric layer on the charge storing layer and forming a cell gate electrode layer on the blocking dielectric layer. Forming the peripheral gate layer includes forming a peripheral gate insulating layer on the semiconductor substrate and forming a peripheral gate conductive layer on the peripheral gate insulating layer. Forming the gate patterns includes removing the cell gate layer from the peripheral circuit region.

In yet other embodiments, semiconductor devices includes a semiconductor substrate comprising a cell array region and cell device isolation patterns in the cell array region that define cell active regions having a convex upper surface. Cell gate patterns cross over the convex upper surfaces of the cell active regions and over the cell device isolation patterns. The semiconductor substrate may further include a peripheral circuit region. The convex upper surfaces may have a radius of curvature that is about $1/10$ to about $1/2$ of a width thereof and a top surface of the cell device isolation pattern may be lower than the convex upper surfaces.

In further embodiments, the device further includes peripheral device isolation patterns in the peripheral circuit region that define peripheral active regions. A peripheral gate pattern is on the peripheral active regions. The peripheral gate patterns includes a stacked peripheral gate insulating layer and a peripheral gate conductive layer. The cell gate patterns includes a stacked tunnel insulating layer, charge storage layer, blocking dielectric layer and cell gate electrode layer. The peripheral gate conductive layer may be a polysilicon layer, the cell gate electrode layer may be a metal nitride, the charge storage layer may be an oxide and/or nitride of silicon, metal and/or metal silicide, and the blocking insulating layer may be an insulating material having a higher dielectric constant than a dielectric constant of the charge storage layer. The charge storage layer may be a silicon nitride layer, the blocking dielectric layer may be an aluminum oxide layer, and the cell gate electrode layer may be a tantalum nitride layer.

In some embodiments, a height of a top surface of the peripheral device isolation pattern is no less than a height of a top surface of the peripheral active region. A first portion of the peripheral gate pattern may be a low voltage transistor, and a second portion of the peripheral gate pattern may be a high voltage transistor. The peripheral gate insulating layer of the peripheral gate pattern may providing the high voltage transistor may be thicker than the peripheral gate insulating layer of the peripheral gate pattern providing the low voltage transistor. The device may further include hemispherical silicon grains between the cell active regions and the cell gate patterns, the hemispherical silicon grains extending from the semiconductor substrate.

BRIEF DESCRIPTION OF THE DRAWINGS

The accompanying drawings, which are included to provide a further understanding of the invention and are incorporated in and constitute a part of this application, illustrate some embodiments of the invention and together with the description serve to explain the invention. In the drawings:

FIGS. 3A through 13A and FIGS. 3B through 13B are cross-sectional views illustrating a method of forming a semiconductor device according to some embodiments of the present invention.

DETAILED DESCRIPTION

Figure 1A:
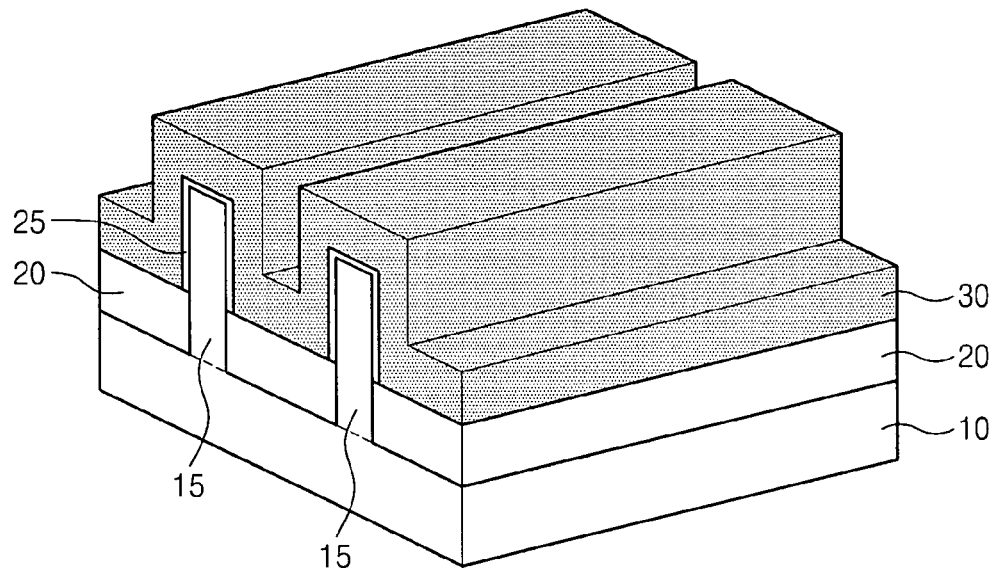
FIGS. 1A and 1B are perspective views illustrating a gate bridge resulting from a method of fabricating a fin-FET according to the prior art.
Figure 1B:
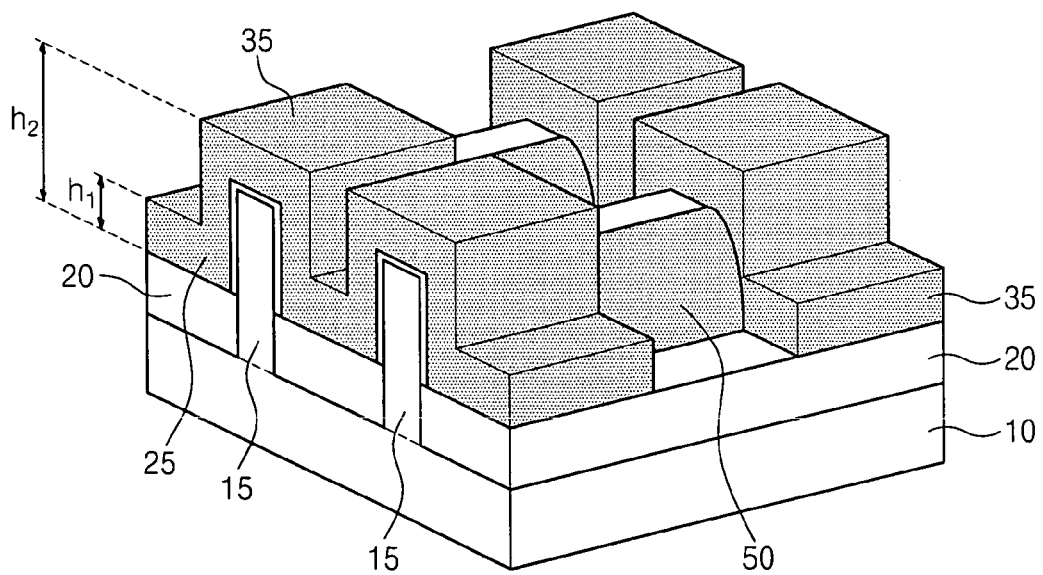

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-sectional illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
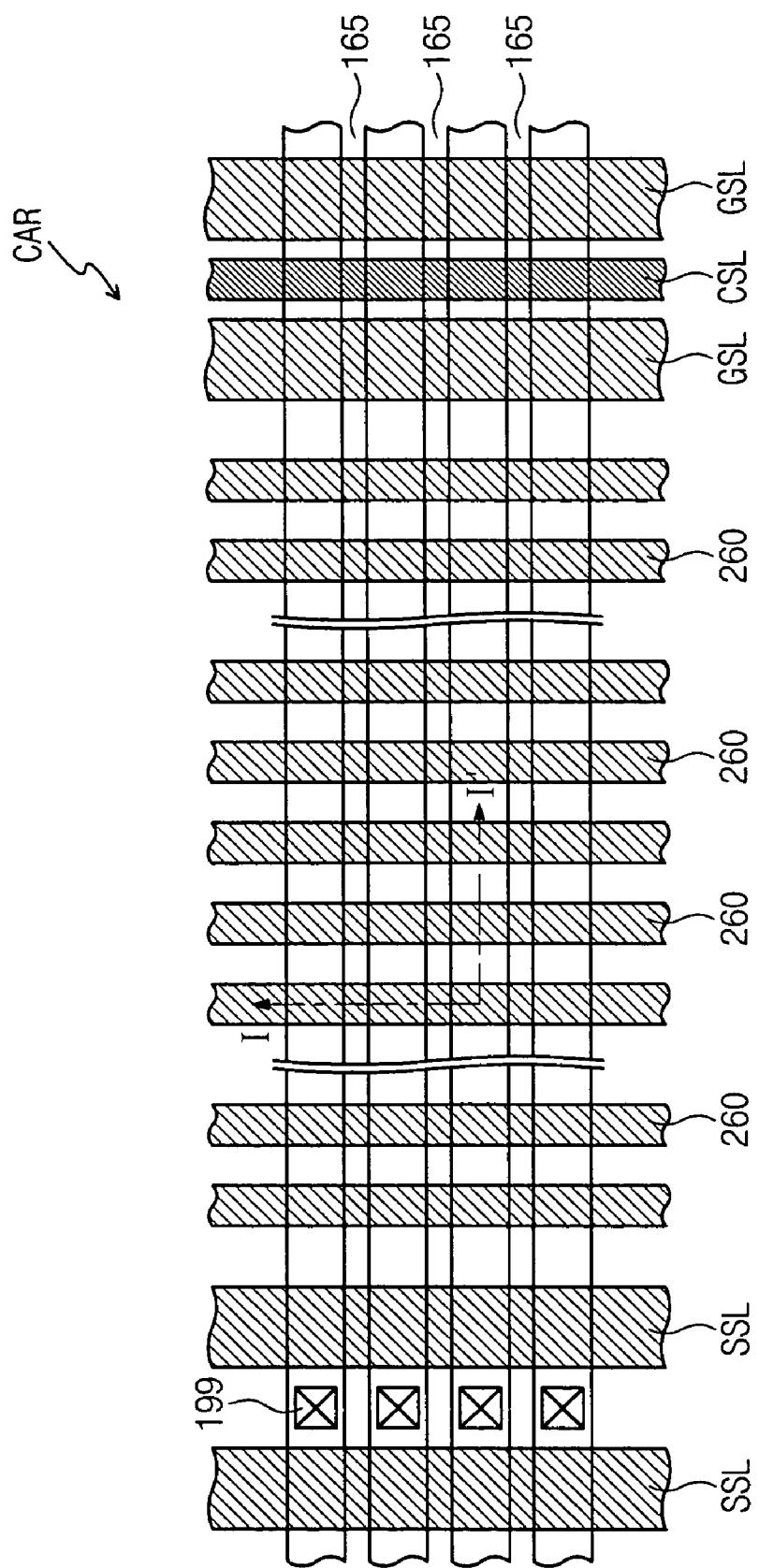
FIG. 2 is a plan view illustrating a portion of a cell array of a semiconductor device according to some embodiments of the present invention.

FIG. 2 is a plan view illustrating a portion of a cell array of a semiconductor device according to some embodiments of the present invention. FIGS. 3A through 13A and FIGS. 3B through 13B are cross-sectional views illustrating a method of forming a semiconductor device according to some embodiments of the present invention. More specifically, FIG. 2 illustrates a portion of a cell array of a NAND flash memory. FIGS. 3A through 13A are cross-sectional views taken along a dotted line I-I' of FIG. 2 and FIGS. 3B through 13B are cross-sectional views illustrating a portion of a peripheral circuit region of the semiconductor device of FIGS. 3A through 13A, respectively.

Figure 13A:
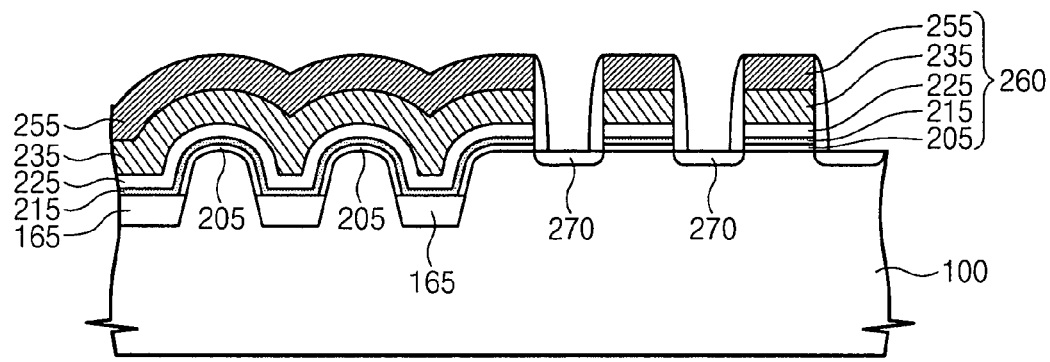

Referring first to FIGS. 2 and 13A, the semiconductor device 100 includes a cell array region CAR and a peripheral circuit region. In the cell array region CAR, recessed device isolation patterns 165 are disposed defining cell active regions. The top surface of the recessed device isolation pattern 165 is lower than the top surface of the cell active region, such that the cell active region has the shape of a fin. A ground select line GSL, a string select line SSL and a plurality of cell gate patterns 260, which cross over the cell active regions, are provided extending over the recessed device isolation pattern 165. The cell gate patterns 260 are shown disposed between the ground and string select lines GSL and SSL. At one side of the ground select line GSL, a common source line CSL is shown disposed in parallel with the cell gate patterns 260. Bit line plugs 199 are shown disposed at one side of the string select line SSL. The bit line plugs 199 are connected to a bit line (not shown) crossing over the cell gate patterns 260.

In some embodiments of the present invention, the cell active region has a convex upper surface with a predetermined radius of curvature (see, e.g., FIG. 13A). In some embodiments of the present invention, the upper surface of the cell active region does not have a flat portion thereof while in other embodiments the convex upper surface may include a flat portion thereof (see, e.g., FIG. 7A). The term top surface and upper surface may be used interchangeably herein with reference to the cell active region and, in either case, a portion of the upper/top surface many not be fully rounded or convex in some embodiments. It will further be understood that references to the active region with a gate pattern extending thereon refers to a channel region of a cell device formed in the active region.

In addition, the top surface of the cell active region in some embodiments has a radius of curvature that is about ⅒ to ½ of the width thereof. Accordingly, a contour line from a central portion of the cell active region to edges thereof may be gently sloping. As a result of such a gentle slope of the top surface of the cell active region, the thickness of the cell gate pattern 260 may not vary much between the central portion of the cell active region and the edges thereof, which may be significantly different from the prior art device structure. As a result, it may be possible to reduce problems with the prior art, such as a conductive residue.

As seen in FIG. 13A, in some embodiments of the present invention, the cell gate pattern 260 includes a tunnel insulating pattern 205, a charge storage pattern 215, a blocking dielectric pattern 225, a cell gate electrode 235 and an upper gate electrode 255, which are sequentially stacked. In some embodiments, the tunnel insulating layer 205 may be a silicon oxide layer having a thickness ranging from about 10 Å to about 200 Å formed by thermal oxidation process. The charge storage pattern 215 in some embodiments may be an oxide and/or nitride of silicon, metal and/or metal silicide. For example, the charge storage pattern 215 may be a silicon nitride layer formed to a thickness ranging from about 20 Å to about 200 Å. In addition, the blocking dielectric pattern 225 may be formed of insulating materials having a higher dielectric constant than the charge storage pattern 215 or the tunnel insulating pattern 205. In some embodiments the charge storage pattern 215 is a silicon nitride layer and the blocking dielectric pattern 225 may be a high dielectric layer or layers, such as an aluminum oxide layer ($Al_2O_3$), a hafnium oxide layer $HfO_2$) and/or the like, and the blocking dielectric pattern 225 may have a thickness ranging from about 50 Å to about 300 Å.

When the blocking dielectric pattern 225 has high dielectric constant, a back-tunneling between the charge storage pattern 215 and the cell gate electrode 235 may be reduced and a coupling ratio may be increased so that it may be possible to fabricate a floating trap type nonvolatile memory device more stably and effectively. The cell gate electrode 235 may be formed of one or more metal nitrides. In some embodiments, the cell gate electrode 235 may be a tantalum nitride layer (TaN) having a thickness ranging from about 100 Å to about 1,000 Å.

Figure 3A:
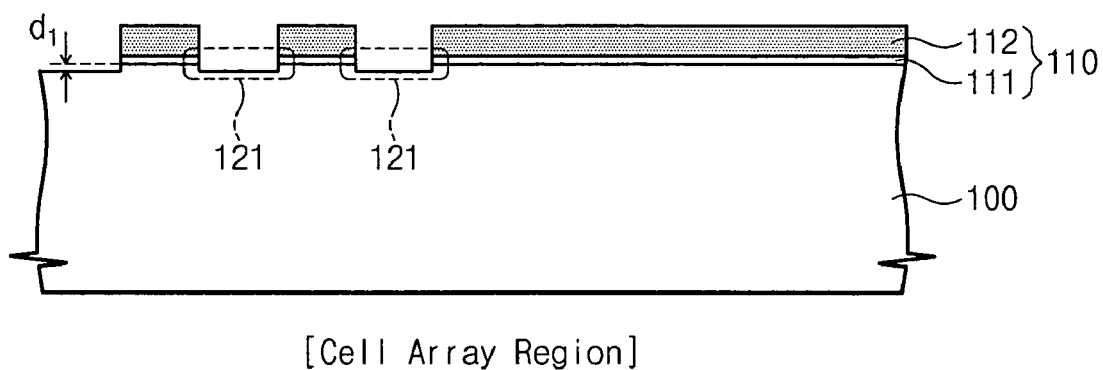
Figure 3B:
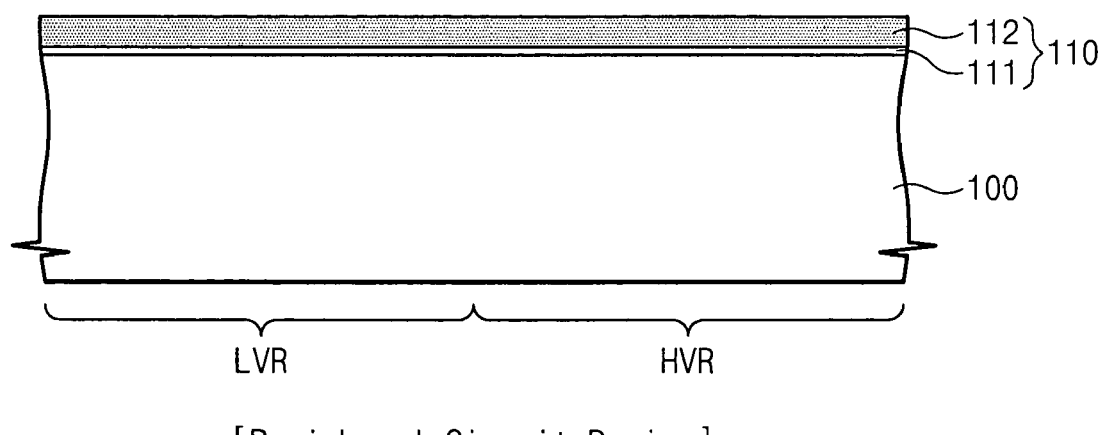

Referring now to FIGS. 3A and 3B, after a trench mask layer is formed on a semiconductor substrate 100 having a cell array region CAR and a peripheral circuit region, the trench mask layer is patterned to form a trench mask pattern 110 defining active regions and device isolation regions. Specifically, the trench mask pattern 110 is disposed on the active region to expose the semiconductor substrate 100 of the device isolation region. Here, the peripheral circuit region will be described for illustrative purposes as including a low voltage region LVR where low-voltage transistors are disposed, and a high voltage region HVR, where high-voltage transistors are disposed.

In some embodiments, the trench mask pattern 110 may be a sequentially stacked oxide pattern 111 and nitride pattern 112. The oxide pattern 111 may be a silicon oxide layer formed by a thermal oxidation process and/or a chemical vapor deposition (CVD) process. The oxide pattern 111 may have a thickness ranging from about 10 Å to about 250 Å The nitride pattern 112 may be a silicon nitride layer formed by CVD process, and may have a thickness ranging from about 50 Å to about 1,000 Å The trench mask pattern 110 may further include a capping pattern (not shown) disposed on the nitride pattern 112. The capping pattern may be a silicon oxide layer, such as a medium temperature oxide (MTO) or the like.

In some embodiments, patterning the trench mask layer may include recessing a top surface of the semiconductor substrate 100 to a predetermined depth dl. In this case, as shown in FIG. 3A, preliminary cell trenches 121 having bottom surfaces lower than the top surface of the semiconductor substrate 100 are formed between the trench mask patterns 110 to expose sidewalls of the oxide pattern 111.

The peripheral circuit region may be entirely covered with the trench mask pattern 110 as shown in FIG. 3B. However, in some embodiments of the present invention, portions of the substrate 100 may be exposed by the trench mask patterns 110 in the peripheral circuit region as well as the cell array region CAR.

Figure 4A:
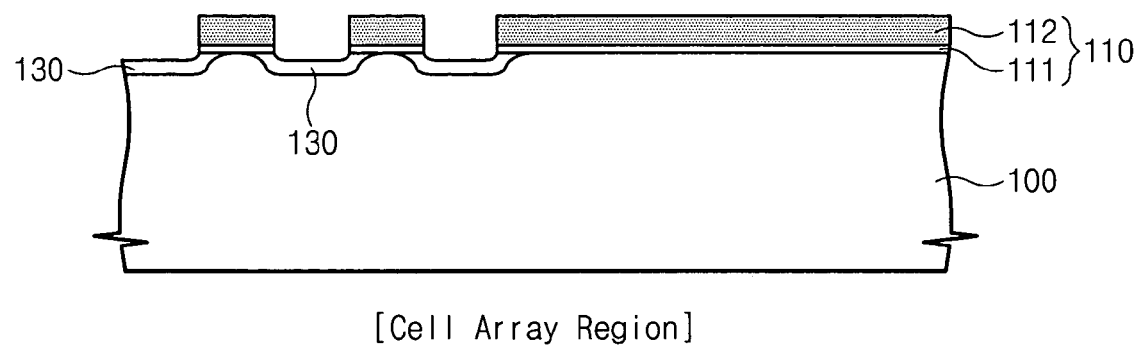
Figure 4B:
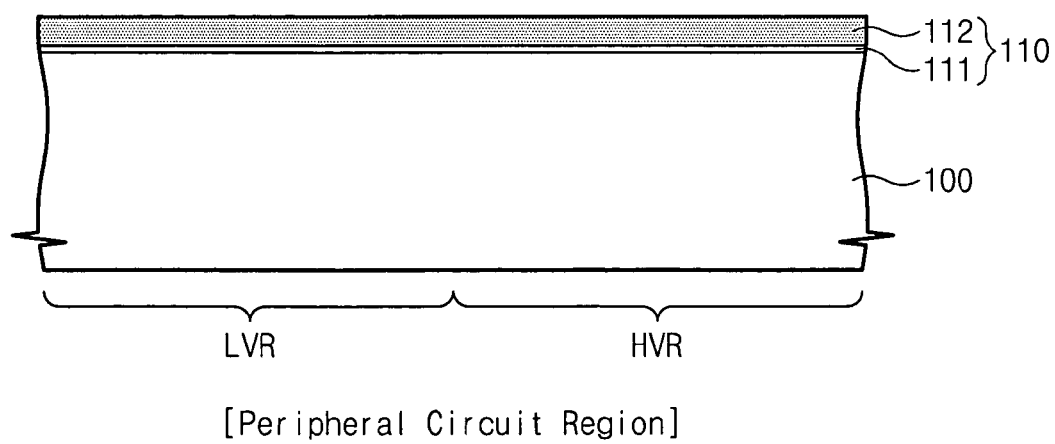

Referring now to FIGS. 4A and 4B, a thermal oxidation process is performed using the trench mask pattern 110 as a mask to form a thermal oxide layer 130 on a bottom surface of the preliminary cell trench 121. The thermal oxidation process may be performed in a temperature range of about 600-1,500 degrees Celsius (C.) for about 10 seconds to about 1 hour in a gas ambient containing oxygen atoms. The thermal oxidation process may be performed in a temperature range of about 900-1,100 degrees Celsius for about 5-15 minutes in an oxygen and/or ozone gas ambient. The oxygen atoms may diffuse under the nitride pattern 112 to react with silicon atoms of the semiconductor substrate 100, thereby increasing the thickness of the oxide pattern 111. Thus, it can be understood that the thermal oxide layer 130 may be a silicon oxide layer formed by the thermal oxidation process and including portions of the oxide pattern 111 of the trench mask pattern 110.

Because the oxygen atoms generally barely penetrate the nitride pattern 112, the nitride pattern 112 may be used as a diffusion mask that limits or even prevents the penetration of the oxygen atoms. Thus, as the length (distance) from the sidewalls of the trench mask pattern 110 increases, the penetration probability of the oxygen atoms may be decreased. The variation of the length-dependent penetration probability of the oxygen atoms may cause the thickness of the thermal oxide layer 130 to vary based on the length (distance) from the sidewalls of the trench mask pattern 110. That is, the thickness of the thermal oxide layer 130 in some embodiments is greater at edges of the trench mask pattern 110 than in a central portion thereof. A shape change of the silicon oxide layer according to the above mechanism is generally called a bird's beak phenomenon.

As the bird's beak phenomenon typically causes the channel length of the transistor or the channel width to be reduced, various conventional technologies have been proposed for minimizing the bird's beak phenomenon. In contrast, for some embodiments of the present invention, there may be no technical problem caused by the bird's beak because the silicon oxide layer additionally formed through the thermal oxide layer is not used as the gate insulating layer of the transistor. Furthermore, as the integration degree of the semiconductor device increases, the width of the silicon oxide layer, of which the thickness increases due to the bird's beak, may become as great as the width of the trench mask pattern 110. Thus, the bird's beak phenomenon can be used in some embodiments for adjusting the radius curvature of the top surface of the semiconductor substrate disposed under the trench mask pattern 110.

The processing conditions of the thermal oxidation process, e.g., time, temperature and/or oxidation gas, may be process parameters affecting the bird's beak phenomenon. Therefore, it is possible to adjust the radius of curvature of the top surface of the semiconductor substrate 100 under the trench mask pattern 110, i.e., the top surface of the active region under the trench mask pattern 110, by controlling these process parameters. In addition, a height difference (see d1 of FIG. 3A) between the bottom surface of the preliminary cell trench 121 and the top surface of the semiconductor substrate 100 of the active region generally has an effect on a diffusion rate of the oxygen atom in the thermal oxidation process and the thickness of the thermal oxide layer 130 at edges of the trench mask pattern 110. Thus, a method of controlling the depth of the preliminary cell trench 121 may be used as a method of adjusting the radius of curvature of the top surface of the active region.

As described above, the trench mask pattern 110 may completely cover the peripheral circuit region. In this case, because the nitride pattern 112 acts as a diffusion mask, the thickness of the oxide pattern 111 in the peripheral circuit region may be unchanged (uniform).

Figure 5A:
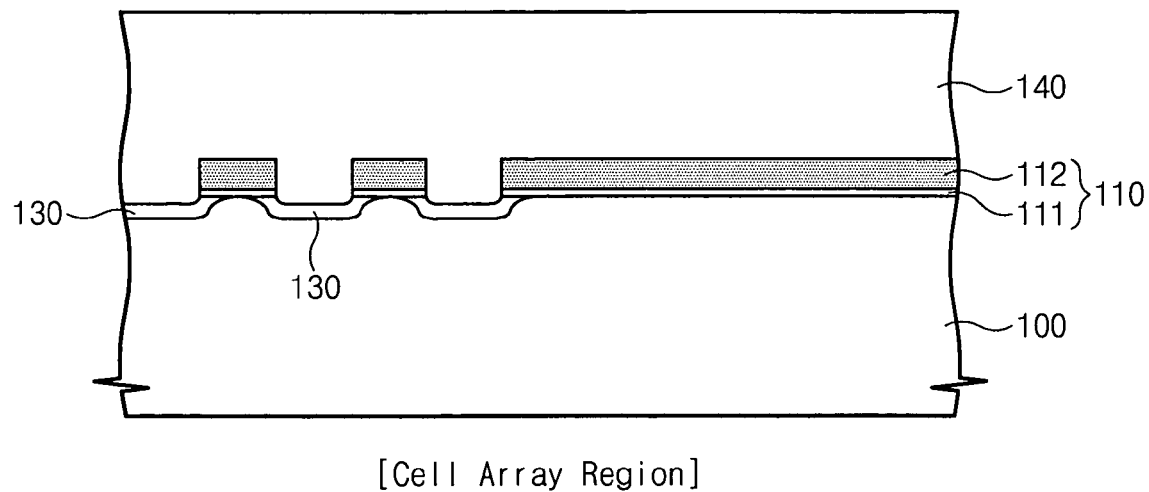
Figure 5B:
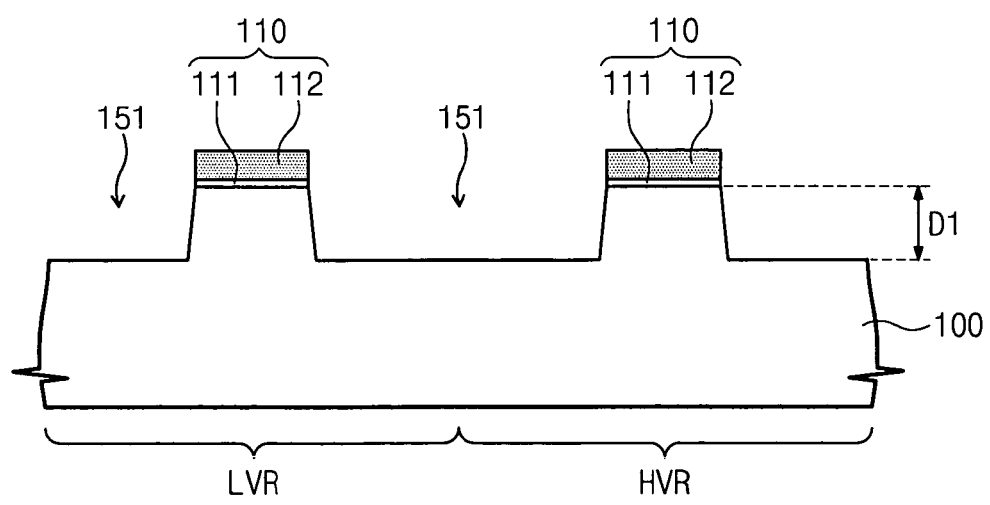

Referring next to FIGS. 5A and 5B, the trench mask pattern 110 is patterned in the peripheral circuit region to define the peripheral circuit region. Preliminary peripheral trenches 151 are formed in the peripheral circuit region using the patterned trench mask pattern 110 as an etch mask. Forming the preliminary peripheral trenches 151 may include forming a first photoresist pattern 140 covering the cell array region CAR but exposing the peripheral circuit region and etching the semiconductor substrate 100 of the peripheral circuit region using the first photoresist pattern 140 and the trench mask pattern 100 as an etch mask.

In some embodiments, the first photoresist pattern 140 may be used as an etch mask for patterning the trench mask pattern 110. In this case, the first photoresist pattern 140 is formed on the trench mask pattern 110 of the peripheral circuit region to define the trench mask pattern 110.

Figure 6A:
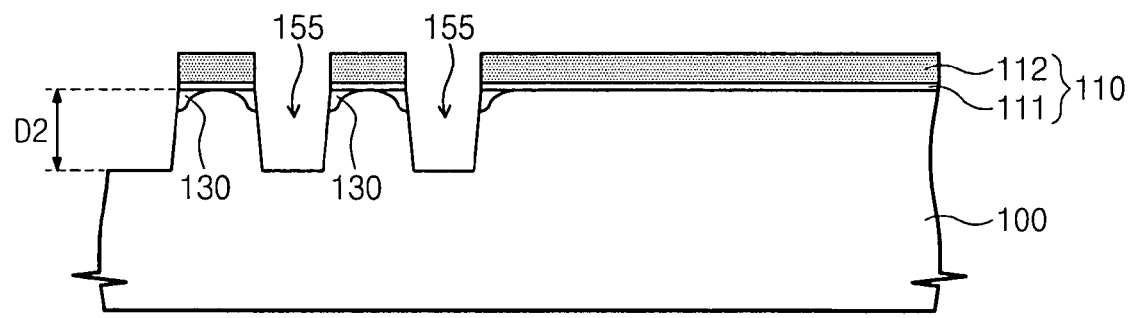
Figure 6B:
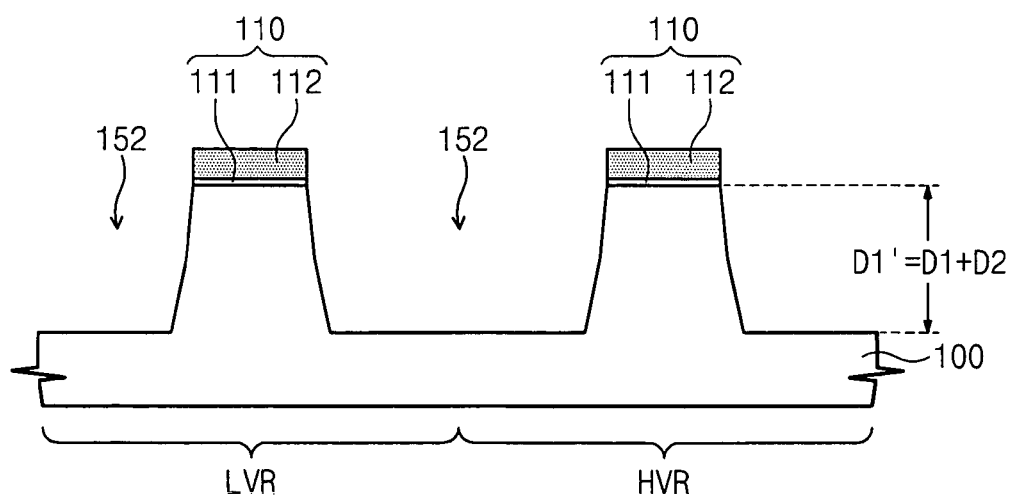

Referring now to FIGS. 6A and 6B, the first photoresist pattern 140 is removed to expose the cell array region CAR. The exposed semiconductor substrate 100 is anisotropically etched using the trench mask pattern 110 as an etch mask. Accordingly, a cell trench 155 is formed in the cell array region CAR to define the cell active region and a peripheral trench 152 is formed in the peripheral circuit region to define the peripheral active region.

The peripheral trench 152 is formed by further etching the preliminary peripheral trench 151 during the etching process for forming the cell trench 155. Thus, the peripheral trench 152 may be deeper than the cell trench 155. More specifically, the depth D1' of the peripheral trench 152 is shown as being substantially equal to a summation of the depth D2 of the cell trench 155 and the depth D1 of the preliminary peripheral trench 151.

Figure 7A:
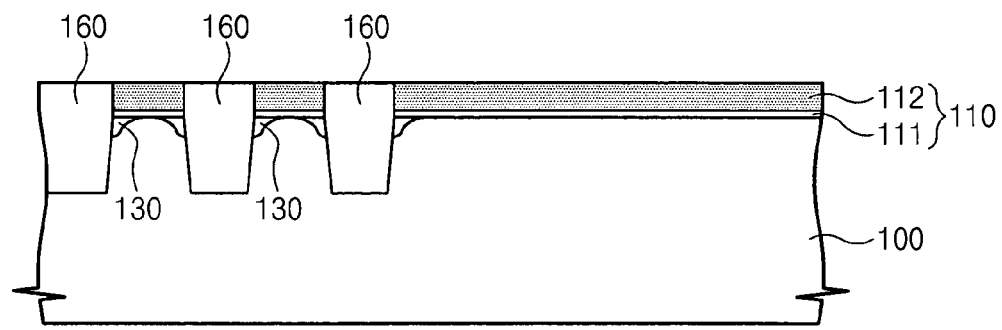
Figure 7B:
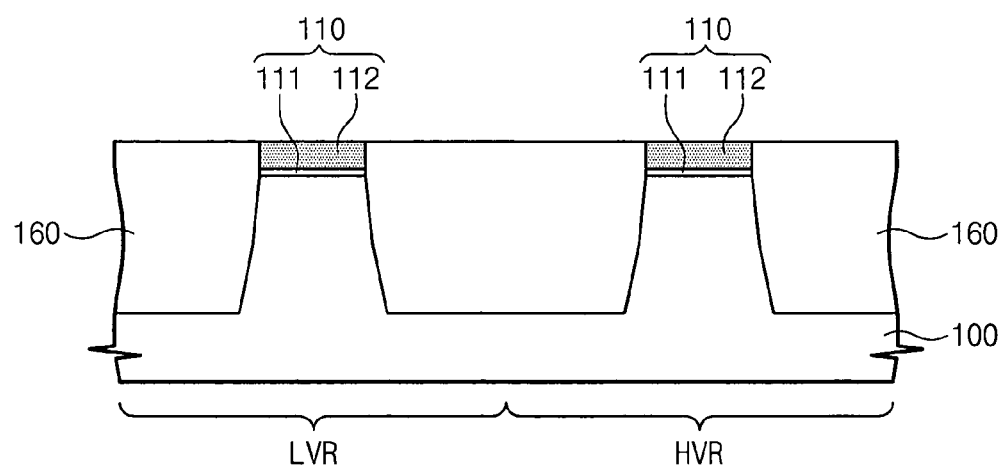

Referring to FIGS. 7A and 7B, a device isolation pattern 160 is shown formed to fill the cell and peripheral trenches 155 and 152. Forming the device isolation pattern 160 may include forming a device isolation layer on the structure where the cell and peripheral trenches 155 and 152 are formed and performing a planarization process to etch the device isolation layer until the top surface of the trench mask pattern 110 is exposed. The planarization process may be performed using a chemical mechanical polishing (CMP) process.

The device isolation layer may be a silicon oxide layer, a silicon nitride layer, a polysilicon layer, an epitaxial silicon layer and/or a low dielectric layer. In some embodiments, the device isolation layer is formed of silicon oxide.

In some embodiments, before forming the device isolation layer, a trench thermal oxidation process many performed to form trench oxide layers on inner walls of the cell and peripheral trenches 155 and 152. The trench thermal oxidation process may have an effect on the structure of the thermal oxide layer 130 under the trench mask pattern 110 and the radius of curvature of the top surface of the cell active region. Therefore, in order to make the top surface of the cell active region have a radius of curvature with a desired dimension, a method of controlling process conditions of the trench thermal oxidation process may be utilized.

In addition, according to some embodiments, a nitride liner may be formed on the inner walls of the cell and peripheral trenches 155 and 152. When forming the trench oxide layer in some embodiments, the nitride liner can be formed between the trench oxide layer and the device isolation pattern. The nitride liner may play a role in limiting or even preventing impurities from diffusing into the active regions, which may stabilize the characteristic of the transistor.

Figure 8A:
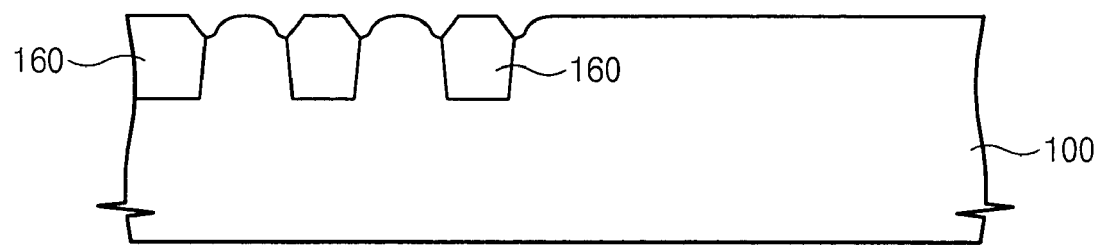
Figure 8B:
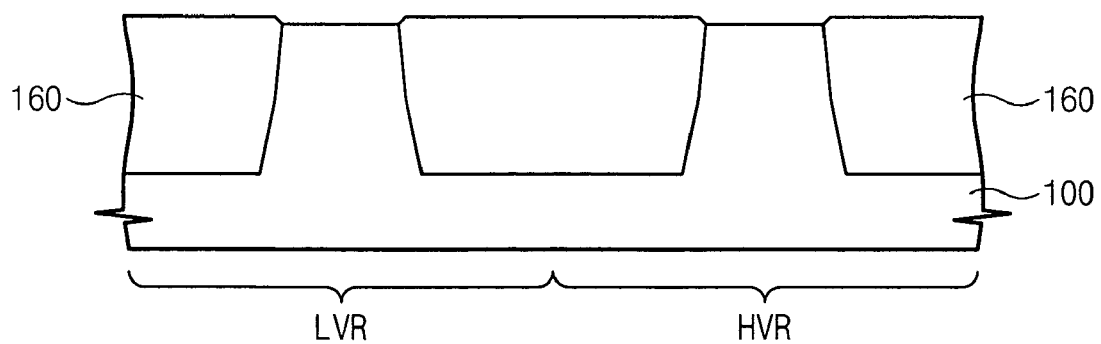

Referring to FIGS. 8A and 8B, the trench mask pattern 110 is removed to expose the top surface of the cell active region and the top surface of the peripheral active region. Removing the trench mask pattern 110 may include removing the nitride pattern 112 to expose the oxide pattern 111 and removing the exposed oxide pattern 111 using an etch recipe having an etch selectivity with respect to the semiconductor substrate 100. As used herein, references to the etching of B material using an etch recipe having an etch selectivity with respect to A material means that the etch process is performed using the etch recipe enabling the A material to be etched minimally but the B material to be etched normally. Removing the nitride pattern 112 may be performed using an etch solution containing phosphoric acid, and removing the oxide pattern 11 may be performed using an etch solution containing hydrofluoric acid.

The device isolation pattern 160 may be formed of a silicon oxide layer as described above. In this case, removing the oxide pattern 111 with the etch solution containing hydrofluoric acid may be performed by etching an exposed upper region of the device isolation pattern 160.

In some embodiments, after removing the trench mask pattern 110, an ion implantation process may be additionally performed onto the exposed cell active region and peripheral active region to adjust impurity concentrations of channel regions of transistors.

Figure 9A:
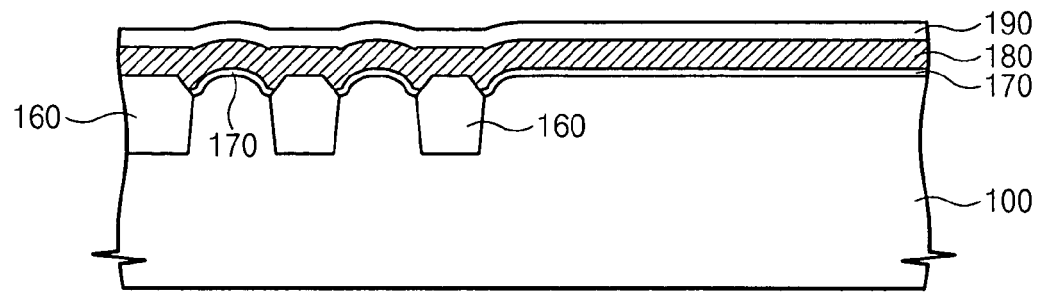
Figure 9B:
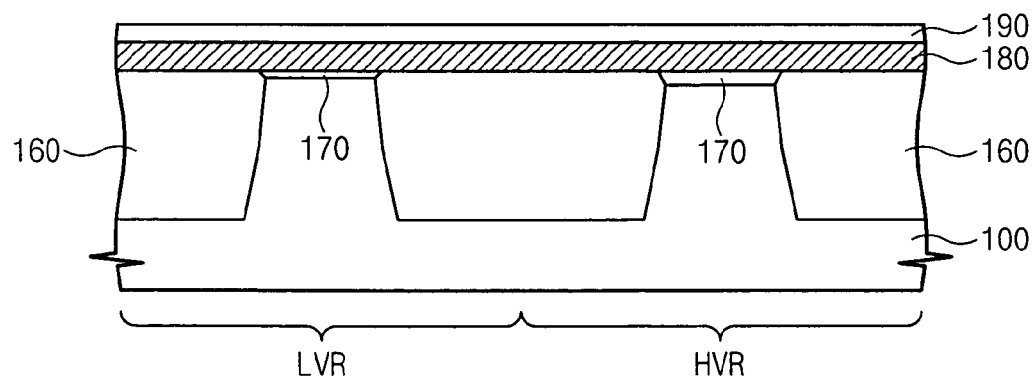

Referring to FIGS. 9A and 9B, a peripheral gate oxide layer 170, a peripheral gate electrode layer 180 and a first gate mask layer 190 are sequentially formed on the semiconductor structure where the trench mask pattern 110 was removed. The peripheral gate oxide layer 170 may be a silicon oxide layer formed using a thermal oxidation process and it may be formed on top surfaces of the active regions of the low and high voltage regions LVR and HVR. The peripheral gate oxide layer 170 is shown formed to a greater thickness in the high voltage region HVR than the low voltage region LVR and the cell array region CAR. The first gate mask layer 190 may be formed of a silicon oxide layer, for example, a medium temperature oxide (MTO).

Figure 10A:
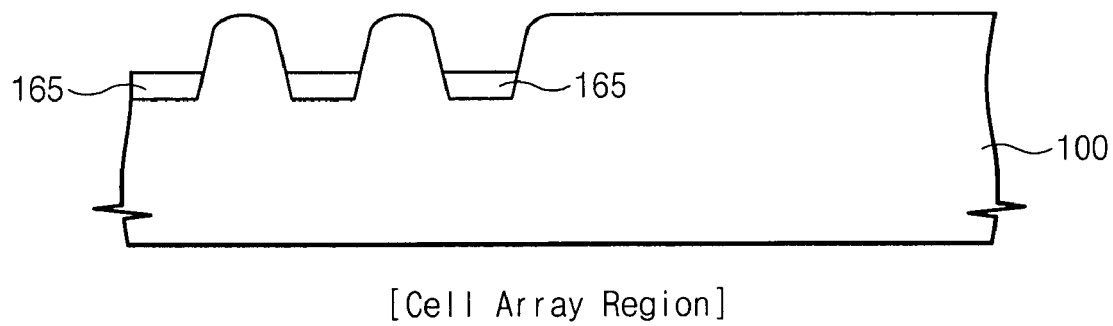
Figure 10B:
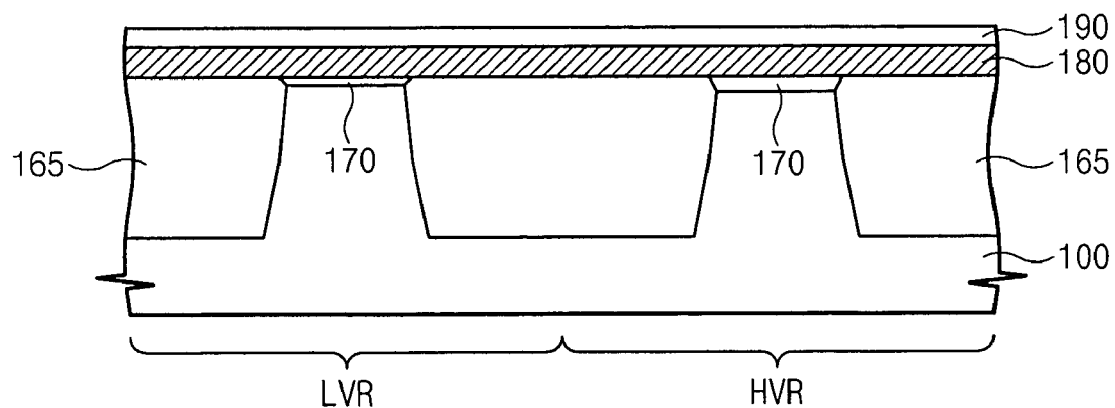

Referring to FIGS. 10A and 10B, a second photoresist pattern is formed on the first gate mask layer 190, such that it covers the peripheral circuit region. Subsequently, the first gate mask layer 190, the peripheral gate electrode layer 180 and the peripheral gate oxide layer 170 are removed from the cell array region CAR using the second photoresist pattern as an etch mask, thereby exposing the top surface of the active region in the cell array region CAR.

The device isolation pattern 160 is etched to form a recessed device isolation pattern 165 exposing the top surface and upper sidewalls of the cell active region. The device isolation pattern 160 of the peripheral circuit region is not recessed and, as a result, it may have a top surface which is higher than or equal to the height of the peripheral active region. Forming the recessed device isolation pattern 165 may include using an etch recipe having an etch selectivity with respect to the semiconductor substrate 100. The etching process generally makes corners of a pattern rounded so that the top surface of the exposed cell active region may be further rounded as a result of this etching process.

The transistor formed in the cell array region CAR may have a fin-FET structure by use of the recessed device isolation pattern 165, as seen in FIG. 13A. Here, a swing performance, a coupling ratio and a channel boosting performance of a fin-FET type transistor may be improved compared with those of a planar type transistor.

In some embodiments, removing the peripheral gate oxide layer 170 may be performed using an etch solution containing hydrofluoric acid. Thus, the device isolation pattern 160 may be recessed while removing the peripheral gate oxide layer 170. Afterwards, the second photoresist pattern may be removed.

Figure 11A:
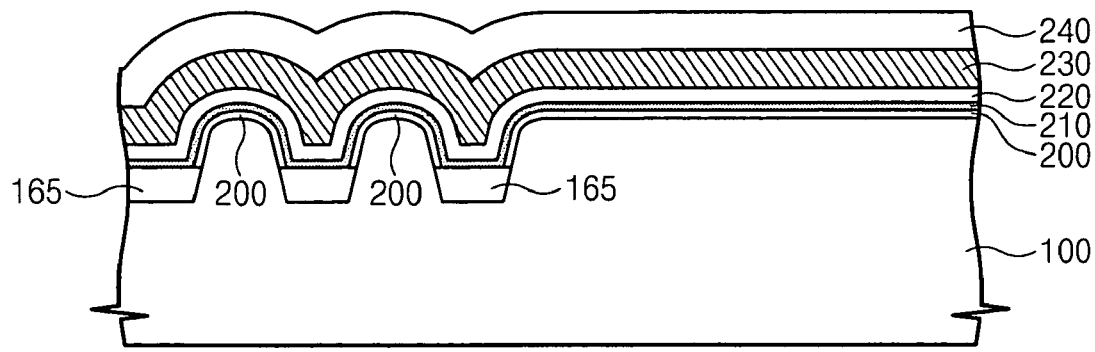
Figure 11B:
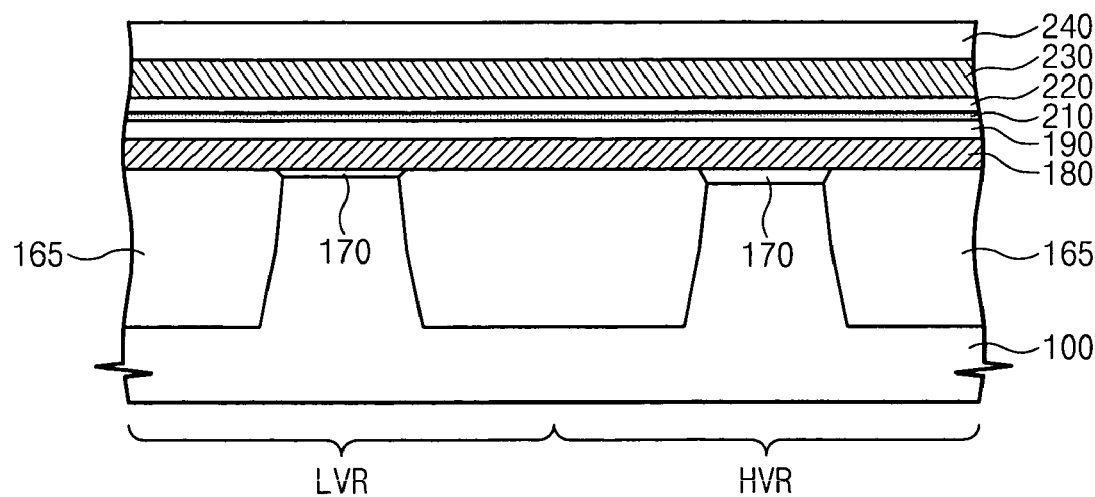

Referring to FIGS. 11A and 11B, a cell gate insulating layer, a cell gate electrode layer 230 and a second gate mask layer 240 are sequentially formed on the semiconductor device in a region including the recessed device isolation pattern 165. The cell gate insulating layer may include a tunnel insulating layer 200, a charge storage layer 210 and a blocking dielectric layer 220.

The tunnel insulating layer 200 may be a silicon oxide layer formed using a thermal oxidation process. The tunnel insulating layer 200 may be locally formed on the exposed surface of the cell active region CAR as shown in FIG. 11A (as compared to FIG. 11B). The thickness of the tunnel insulating layer 200 may range from about 10 Å to about 200 Å.

The charge storage layer 210 may be an oxide and/or nitride of silicon, metal and/or metal silicide. For example, the charge storage layer 210 may be a silicon nitride layer formed to a thickness ranging from about 20 Å to about 200 Å.

The blocking dielectric layer 220 may be formed of insulating materials having a higher dielectric constant than the charge storage layer 210. When the charge storage layer 210 is a silicon nitride layer, the blocking dielectric layer 220 may be one or more high dielectric layers, such as an aluminum oxide layer ($Al_2O_3$), a hafnium oxide layer ($HfO_2$) or the like, and may have a thickness ranging from about 50 Å to about 300 Å. When the blocking insulating layer 220 has a high dielectric constant, a back-tunneling between a charge storage pattern (see reference numeral 215 of FIG. 13A) and a cell gate electrode (see reference numeral 235 of FIG. 13A), which will be formed in a following process, may be decreased and the coupling ratio may be increased. Therefore, it is possible in some embodiments to form a floating trap type nonvolatile memory device more stably and effectively.

The cell gate electrode layer 230 may be formed of one or more metal nitrides. For instance, the cell gate electrode 230 may be a tantalum nitride (TaN) layer having a thickness ranging from about 100 Å to about 1,000 Å. In addition, the second gate mask layer 240 may be formed of the same material, e.g., silicon oxide, as the first gate mask layer 190.

Figure 12A:
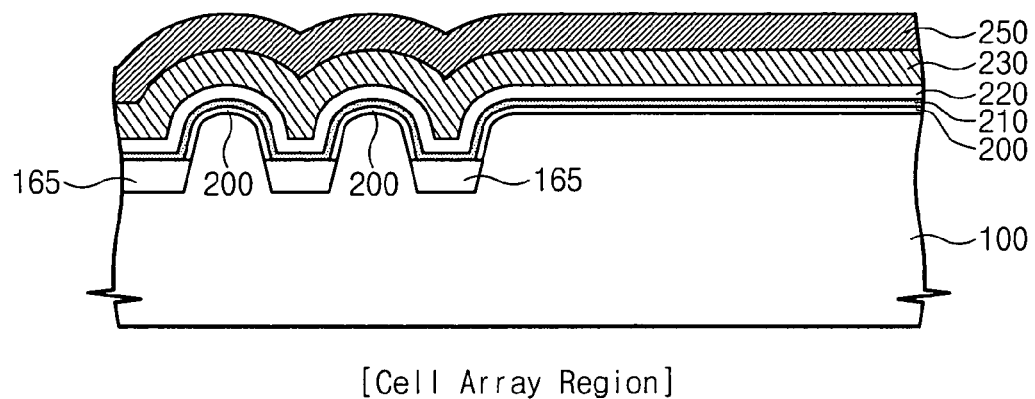
Figure 12B:
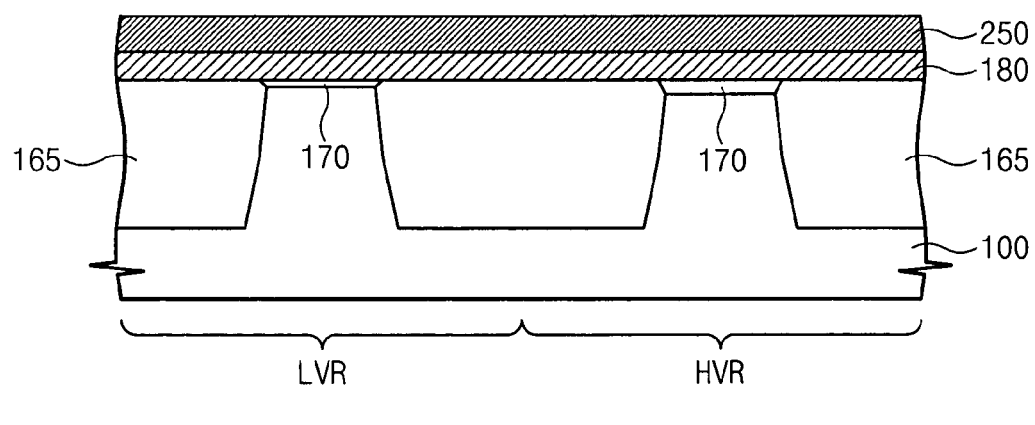

Referring to FIGS. 12A and 12B, a third photoresist pattern is formed that covers the cell array region CAR but exposes the peripheral circuit region. Subsequently, the second gate mask layer 240, the cell gate electrode layer 230, and the cell gate insulating layer are sequentially etched using the third photoresist pattern as an etch mask until the first gate mask layer 190 is exposed.

Thereafter, the third photoresist pattern is removed. Accordingly, the second gate mask layer 240 is exposed in the cell array region CAR, and the first gate mask layer 190 is exposed in the peripheral circuit region. The exposed first and second gate mask layers 190 and 240 are removed to expose the cell gate electrode layer 230 and the peripheral gate electrode layer 180 in the cell array region CAR and the peripheral circuit region, respectively. An upper gate electrode layer 250 is formed that covers the exposed cell gate electrode layer 230 and the exposed peripheral gate electrode layer 180. The upper gate electrode layer 250 may be formed of one or more metal layers and/or metal silicide layers.

Figure 13B:
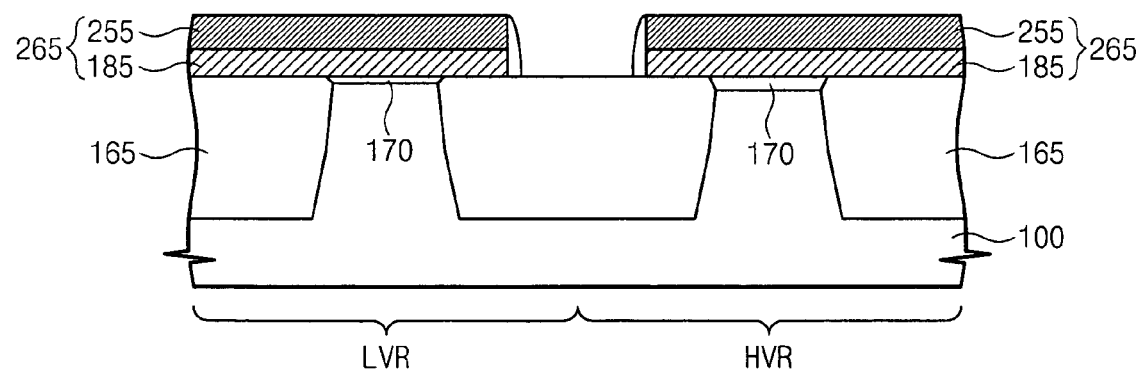

Referring to FIGS. 13A and 13B, the upper gate electrode layer 250, the cell gate electrode layer 230 and the cell gate insulating layer are patterned in the cell array region CAR to form cell gate patterns 260 crossing over the cell active regions. The illustrated cell gate pattern 260 includes a sequentially stacked tunnel insulating pattern 205, a charge storage pattern 215, a blocking dielectric pattern 225, a cell gate electrode 235 and an upper gate electrode 255.

As described above, due to the bird's beak occurring in forming the thermal oxide layer 130, the upper edges and top surface of the cell active region are rounded. In some embodiments of the present invention, the existence of the preliminary cell trench 121 and/or the recess of the device isolation pattern 160 also affect the rounding of the cell active region. The rounding of the cell active region causes the protruded sidewall of the cell active region to have a more gentle slope. As a result, thickness dispersions of the upper gate electrode layer 250 and the cell gate electrode 230 may be reduced. That is, in the patterning process for forming the cell gate pattern 260, the upper gate electrode layer 250 and the cell gate electrode 230 can be patterned while the problem of the conductive residue may be minimized.

In particular, according to some embodiments of the present invention, it is possible to minimize the recess depth of the device isolation pattern 160. For example, the recessed device isolation pattern 165 may be recessed until the top surface of the recessed device isolation pattern 165 is equal in height to the edges of the top surface of the cell active region. In this case, as the cell active region has the convex rounded surface, it is possible to limit or even prevent the formation of the conductive residue because of the round shape of the cell active region, which may provide performance advantages in the resulting fin-FET transistor.

Furthermore, the upper gate electrode layer 250 and the peripheral gate electrode layer 180 are patterned in the peripheral circuit region to form the peripheral gate pattern 265 crossing over the peripheral active region. The peripheral gate pattern 265 includes the sequentially stacked peripheral gate electrode 185 and the upper gate electrode 255.

Figure 14:
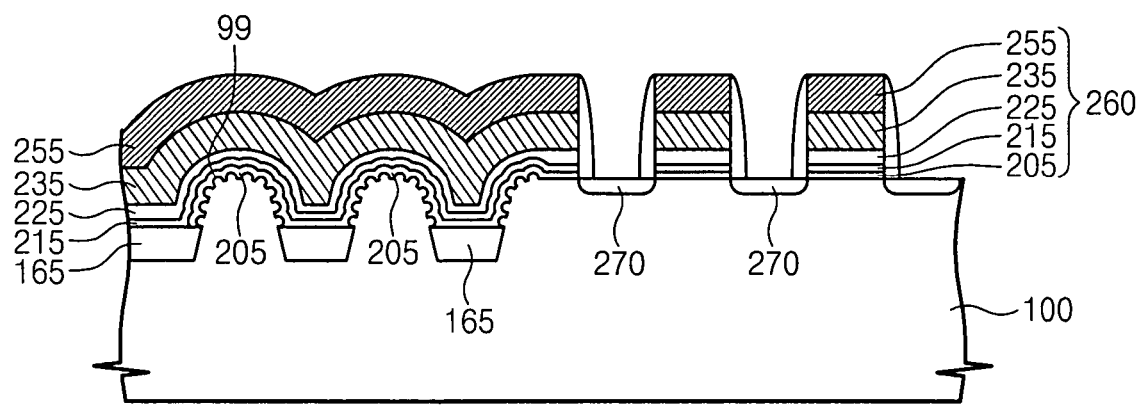
FIG. 14 is a cross-sectional view of a semiconductor device according to some embodiments of the present invention.

FIG. 14 is a cross-sectional illustration of a semiconductor device according to some further embodiments of the present invention. The illustrated embodiments of FIG. 14 are similar to the above-described embodiments except that hemispherical silicon grains are formed in the cell active region. Thus, for the sake of conciseness, any repetitive description will be omitted herein.

Referring now to FIGS. 10A and 14, after forming the recessed device isolation pattern 165, a process of forming the hemispherical silicon grains is performed to form the hemispherical silicon grains on the top surface and upper sidewalls of the exposed cell active region. Accordingly, effective surface areas of the cell active region and the cell gate insulating layer may be increased. As a result, the nonvolatile memory device may have an increased coupling ratio.

In some embodiments of the present invention, the top surface of the cell active region is rounded using the bird's beak phenomenon. Therefore, it is possible to reduce the conductive residue causing the gate bridge. In addition, as the transistor provided by some embodiments of the present invention has the fin-FET structure, in which the device isolation pattern is recessed, the transistor may have enhanced swing performance, coupling ratio and channel boosting performance in comparison with the conventional planar transistor.

As described above, some embodiments of the present invention provide methods of forming a semiconductor device capable of fabricating a fin-FET with little or no conductive residue. Some embodiments provide a method of forming a nonvolatile memory device that are suited for high integration device fabrication. Semiconductor devices including a fin-FET capable of restraining the occurrence of a conductive residue are also provided in some embodiments as well as a nonvolatile memory device that is suited for high integration devices.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of forming a semiconductor device, the method comprising:
    forming a trench mask pattern on a semiconductor substrate having active regions and device isolation regions;
    performing a thermal oxidation process using the trench mask pattern as a diffusion mask to form a thermal oxide layer defining a convex upper surface of the active regions;
    etching the thermal oxide layer and the semiconductor substrate using the trench mask pattern as an etch mask to form trenches defining convex upper surfaces of the active regions;
    forming device isolation patterns filling the trenches;
    removing the trench mask pattern to expose the convex upper surfaces of the active regions; and
    forming gate patterns extending over the active regions.

2. The method of claim 1, wherein forming the trench mask pattern comprises:
    forming an oxide pattern on the semiconductor substrate; and
    forming a nitride pattern as the diffusion mask on the oxide pattern.

3. The method of claim 2, wherein the forming the trench mask pattern comprises:
    forming the oxide layer and the nitride layer on the semiconductor substrate; and
    patterning the oxide layer and the nitride layer to form the trench mask pattern defining preliminary cell trenches, wherein the preliminary cell trenches are formed on the device isolation regions and bottom surfaces of the preliminary cell trenches are lower than a top surface of the semiconductor substrate in the active regions.

4. The method of claim 3, wherein a radius of curvature of the convex upper surface of the active regions and a thickness of the thermal oxide layer at edges of the trench mask pattern are controlled based on a height difference between the bottom surface of the preliminary cell trench and the top surface of the semiconductor substrate in the active regions.

5. The method of claim 2, wherein performing the thermal oxidation process comprises performing the thermal oxidation process in a temperature range of about 600 to about 1,500 degrees Celsius for about 10 seconds to about 1 hour in a gas ambient including oxygen atoms.

6. The method of claim 2, wherein performing the thermal oxidation process comprises performing the thermal oxidation process to provide a thickness of the thermal oxide layer under edge portions of the trench mask pattern greater than a thickness of the thermal oxide layer under a central portion of the trench mask pattern.

7. The method of claim 6, forming the nitride pattern comprises forming the nitride pattern to a thickness that limits oxygen diffusion while performing the thermal oxidation process to provide the thickness of the thermal oxide layer under the edge portions greater than the thickness of the thermal oxide layer under the central portion.

8. The method of claim 1, wherein forming the gate patterns comprises:
    recessing the device isolation patterns to expose sidewalls of the active regions;
    forming a cell gate layer on the active regions and the recessed device isolation pattern, the cell gate layer including a tunnel insulating layer, a charge storage layer, a blocking dielectric layer and a cell gate electrode layer; and
    patterning the cell gate layer to form the gate patterns extending over the active regions.

9. The method of claim 8, wherein the cell gate electrode layer comprises a metal nitride and wherein the charge storage layer comprises an oxide and/or nitride of silicon, metal and/or metal silicide and wherein the blocking insulating layer comprises an insulating material having a higher dielectric constant than a dielectric constant of the charge storage layer.

10. The method of claim 8, wherein the charge storage layer comprises a silicon nitride layer, the blocking dielectric layer comprises an aluminum oxide layer and the cell gate electrode layer comprises a tantalum nitride layer.

11. The method of claim 8, wherein forming the cell gate layer is preceded by forming hemispherical silicon grains on the convex upper surface of the active regions.

12. The method of claim 2, wherein the semiconductor substrate comprises a cell array region and a peripheral circuit region and wherein etching the thermal oxide layer and the semiconductor substrate comprises:
    forming a photoresist layer covering the cell array region and exposing the peripheral circuit region;
    etching the semiconductor substrate using the photoresist pattern and the trench mask pattern as an etch mask to form preliminary peripheral trenches in the peripheral circuit region;
    removing the photoresist pattern; and then
    etching the semiconductor substrate of the cell array region and the bottom surfaces of the preliminary peripheral trenches of the peripheral circuit region using the trench mask pattern as an etch mask to form cell trenches in the cell array region and peripheral trenches in the peripheral circuit region.

13. The method of claim 12, wherein a depth of the peripheral trench is substantially equal to a sum of a depth of the preliminary peripheral trench and a depth of the cell trench.

14. The method of claim 12, wherein forming the gate patterns comprises forming cell gate patterns in the cell array region and forming peripheral gate patterns in the peripheral circuit region, wherein forming the cell gate patterns comprises forming a tunnel insulating pattern, a charge storage pattern, a blocking dielectric pattern and a cell gate electrode which are sequentially stacked, and wherein forming the peripheral gate patterns comprises forming a peripheral gate insulating pattern and a peripheral gate conductive pattern which are sequentially stacked.

15. The method of claim 14, wherein forming the cell gate patterns comprises:

recessing the device isolation patterns in the cell array region to expose sidewalls of the active regions in the cell array region;

forming a cell gate layer, including a tunnel insulating layer, a charge storage layer, a blocking dielectric layer and a cell gate electrode layer, on the recessed device isolation patterns and the active regions in the cell array region; and patterning the cell gate layer to form the cell gate patterns extending over the active regions.

16. The method of claim 12, wherein forming the gate patterns comprises:

forming a peripheral gate layer on the resultant structure in which the trench mask patterns are removed;

patterning the peripheral gate layer to remove the peripheral gate layer from the cell array region;

recessing the device isolation patterns in the cell array region to expose sidewalls of the active region in the cell array region;

forming a cell gate layer on the semiconductor substrate having the recessed device isolation patterns; and patterning the cell gate layer to form the gate patterns extending over the active regions.

17. The method of claim 16, wherein:

forming the cell gate layer comprises:

forming a tunnel insulating layer on the semiconductor substrate;

forming a charge storage layer on the tunnel insulating layer;

forming a blocking dielectric layer on the charge storing layer; and forming a cell gate electrode layer on the blocking dielectric layer; and forming the peripheral gate layer comprises:

forming a peripheral gate insulating layer on the semiconductor substrate; and forming a peripheral gate conductive layer on the peripheral gate insulating layer; and forming the gate patterns includes removing the cell gate layer from the peripheral circuit region.

\* \* \* \* \*